US010249493B2

(12) United States Patent
Aarts et al.

(10) Patent No.: US 10,249,493 B2
(45) Date of Patent: Apr. 2, 2019

(54) METHOD FOR DEPOSITING A LAYER ON A SEMICONDUCTOR WAFER BY VAPOR DEPOSITION IN A PROCESS CHAMBER

(71) Applicant: Siltronic AG, Munich (DE)

(72) Inventors: Wilhelmus Aarts, Portland, OR (US);
Jason Van Horn, Portland, OR (US);
Randal Gieker, Vancouver, WA (US)

(73) Assignee: SILTRONIC AG, Munich (DE)

( * ) Notice: Subject to any disclaimer, the term of this patent is extended or adjusted under 35 U.S.C. 154(b) by 18 days.

(21) Appl. No.: 14/983,586

(22) Filed: Dec. 30, 2015

(65) Prior Publication Data

US 2017/0194137 A1     Jul. 6, 2017

(51) Int. Cl.
*H01L 21/02* (2006.01)
*H01L 21/3065* (2006.01)
*H01L 29/30* (2006.01)

(52) U.S. Cl.
CPC .... *H01L 21/0262* (2013.01); *H01L 21/02532* (2013.01); *H01L 21/02576* (2013.01); *H01L 21/02661* (2013.01); *H01L 21/3065* (2013.01); *H01L 29/30* (2013.01)

(58) Field of Classification Search
CPC .. H01L 21/0262; H01L 21/3065; H01L 29/30
See application file for complete search history.

(56) References Cited

U.S. PATENT DOCUMENTS

| | | | |
|---|---|---|---|
| 5,487,358 A | 1/1996 | Ohta et al. | |
| 5,498,578 A * | 3/1996 | Steele | H01L 27/0623 117/95 |
| 5,525,157 A * | 6/1996 | Hawkins | C30B 25/14 118/715 |
| 5,904,769 A | 5/1999 | Ohashi et al. | |
| 6,013,319 A | 1/2000 | Dietze | |
| 6,110,290 A | 8/2000 | Maeda | |
| 6,517,632 B2 | 2/2003 | Minami et al. | |
| 7,033,962 B2 | 4/2006 | Takeno | |
| 9,425,101 B2 * | 8/2016 | Xiao | H01L 29/7854 |
| 2003/0109095 A1 * | 6/2003 | Boydston | C30B 25/18 438/200 |
| 2006/0073679 A1 * | 4/2006 | Airaksinen | C23C 16/24 438/478 |
| 2006/0154453 A1 * | 7/2006 | Son | C30B 25/04 438/482 |
| 2010/0129993 A1 * | 5/2010 | Yokokawa | H01L 21/02532 438/479 |
| 2012/0299121 A1 * | 11/2012 | Wu | H01L 21/2257 257/408 |
| 2013/0078743 A1 | 3/2013 | Brenninger | |
| 2014/0251203 A1 * | 9/2014 | Suzuki | C30B 25/16 117/90 |
| 2014/0252376 A1 * | 9/2014 | Itoh | H01L 29/1608 257/77 |

FOREIGN PATENT DOCUMENTS

EP     0808917 A1    11/1997
EP     1042544 B1    10/2002

* cited by examiner

*Primary Examiner* — A. Sefer
(74) *Attorney, Agent, or Firm* — Legdig, Voit & Mayer, Ltd.

(57) ABSTRACT

A method for depositing a layer on a semiconductor wafer by vapor deposition in a process chamber, involves removing native oxide from a surface of the wafer; and then depositing an epitaxial layer with a thickness of at least 40 µm on the surface of the wafer by introducing a silicon containing gas and a carrier gas into the process chamber, wherein the flow rate of the silicon containing gas is lower than 10 standard liters per minute and the flow rate of the carrier gas is at least 40 standard liters per minute.

16 Claims, No Drawings

METHOD FOR DEPOSITING A LAYER ON A SEMICONDUCTOR WAFER BY VAPOR DEPOSITION IN A PROCESS CHAMBER

FIELD

The present invention relates to a method for depositing a layer on a semiconductor wafer by vapor deposition in a process chamber.

BACKGROUND

Semiconductor wafers are often provided with a layer produced by means of vapor deposition. The semiconductor wafer is usually held by a rotating susceptor during the deposition of the layer, said susceptor being arranged in a process chamber. Upper and lower covers (domes) form boundaries of the process chamber which are transmissive to thermal radiation and through which radiation energy is transmitted into the process chamber and onto the semiconductor wafer. Process chambers for vapor deposition have been described for instance in U.S. Pat. No. 5,487,358 and US 2013/0078743 A1.

The semiconductor wafer is heated to a specific temperature that is optimal for the deposition of the layer. The process chamber furthermore has on the side walls connections for introducing process gas into the process chamber and for discharging process gas and gaseous products of the process gas from the process chamber. The process gas is conducted over the side area of the semiconductor wafer that is to be coated. Upon contact with the semiconductor wafer heated to deposition temperature, process gas is decomposed and the desired layer is deposited on the semiconductor wafer.

Epitaxial deposition processes are disclosed for example in U.S. Pat. Nos. 5,904,769A, 6,110,290A and EP 1 042 544 B1.

In order to fulfill the continuously increasing quality requirements, the uniform deposition of the deposited layer on one side of the semiconductor wafer is required. The uniformity of the deposited layer and therefore the geometry of the wafer surface is negatively affected for instance by inhomogeneous gas flows due to turbulences within the reaction chamber. Such turbulences may occur due to deposits on inner parts of the reaction chamber, for example on parts of the susceptor, the inner surface of the upper cover or the inner side of the side walls.

In order to avoid such an inhomogeneous gas flow, U.S. Pat. No. 6,013,319 discloses the placement of one or more baffles within the reaction chamber in order to reduce gas flow turbulences and correspondingly reduce epitaxial layer thickness variations during processing resulting in a better flatness and layer thickness control. However, the surface of the baffles can also be affected by deposits resulting in changes of the flow situation within the reaction chamber.

Because it is not possible to completely prevent depositing of products of the process gas in the interior of the process chamber, it is necessary to clean the process chamber at specific intervals. Cleaning is effected by means of vapor phase etching, for example.

Semiconductor wafers cannot be coated during the cleaning of the process chamber. Therefore, there is a great interest in having to carry out the cleaning of the process chamber as infrequently as possible.

For this reason, EP 0 808 917 A1 recommends controlling the temperature of the walls of the process chamber within a narrow temperature range in a control loop. It specifically proposes cooling the process chamber by means of a cooling gas from outside and controlling the temperature of the walls by controlling the inflow of cooling gas to a target temperature.

According to US 2013/0078743 A1 the coating of the inner surface of the upper cover with products of the process gas begins temporally later in the center of the upper cover than at locations that are distant from the center of the upper cover. Hence it is therefore advantageous to measure the temperature of the upper cover in the center of the outer surface of the upper cover.

SUMMARY

An aspect of the invention provides a method for depositing a layer on a semiconductor wafer by vapor deposition in a process chamber, the method comprising: removing native oxide from a surface of the semiconductor wafer; and then depositing an epitaxial layer with a thickness of at least 40 μm on the surface of the semiconductor wafer, by a process comprising introducing a silicon-comprising gas and a carrier gas into the process chamber, wherein a silicon-comprising gas flow rate is lower than 10 standard liters per minute, and wherein a carrier gas flow rate is at least 40 standard liters per minute.

DETAILED DESCRIPTION

An aspect of the present invention is based on our disclosure that, despite careful control of the temperature of, for example, the surface of the cover of the process chamber, it is not possible to prevent the products of the process gas from depositing in the interior of the process chamber. This depositing of the products of the process gas, e.g. silicon deposits in case of trichlorosilane, TCS, occurs to a larger extent if the thickness of the cumulative epitaxial layer deposition increases.

Beside the problems mentioned in the Background, resulting from the coating of the interior of the process chamber, the coating causes temperature shifts resulting in poor resistivity profiles and crystallographic sliplines.

Therefore, an aspect of the present invention is to propose improvements directed against the occurrence of such deposition of products of the process gas in the interior of the process chamber while depositing a thick epitaxial layer and to produce wafer with a thick epitaxial layer with a defined wafer resistivity variation and a defined wafer geometry while avoiding crystallographic sliplines from temperature nonuniformities.

An aspect of the invention provides a method for depositing a layer on a semiconductor wafer by vapor deposition in a process chamber, wherein native oxide is removed from a surface of the wafer and then an epitaxial layer with a thickness of at least 40 μm is deposited on the surface of the wafer by introducing a silicon containing gas and a carrier gas into the process chamber, wherein the flow rate of the silicon containing gas is lower than 10 standard liters per minute (slm) and the flow rate of the carrier gas is at least 40 standard liters per minute (slm).

Preferably the flow rate of the silicon containing gas is at 5-8 standard liters per minute and the flow rate of the carrier gas is more than 50 standard liters per minute.

According to a preferred embodiment a temperature in the reaction chamber is adjusted to between about 1050° C. and about 1150° C. during deposition of the epitaxial layer.

In a further embodiment the wafer is etched before deposition of the epitaxial layer.

The invention is also directed to a semiconductor wafer comprising an epitaxial layer having a thickness of 40 μm to 150 μm, characterized by slip lines of less than 15 mm and a flatness $SFQR_{max}$ (25×25 mm pattern) of not more than 0.8 μm.

Preferably the wafer has not more than 6 LLS defects ≥0.2 μm and not more than 4 LLS defects ≥0.3 μm.

Among the objects of the present invention is the provision of a single crystal silicon wafer which (a) has an epitaxial surface with a certain homogeneous thickness while unwanted coating of the inner parts of the reaction chamber is maintained at a level that does not affect the temperature control of the process chamber and therefore does not affect the temperature distribution of the process chamber.

Briefly, the present invention is directed to a single crystal silicon wafer comprising a silicon wafer substrate having a front surface and a back surface, a circumferential edge, and a radius extending from the central axis to the circumferential edge of the wafer.

The single crystal silicon wafer further comprises an epitaxial silicon layer on the front surface of the silicon wafer substrate. The epitaxial silicon layer is characterized by a resistivity and thickness uniformity of the deposited layer (including crystallographic sliplines from temperature nonuniformities) as well as the stability of the doping profile.

Other objects and features of this invention will be in part apparent and in part pointed out hereinafter.

The starting material for the present invention preferably is a single crystal silicon wafer substrate which has been sliced from a single crystal ingot grown in accordance with any of the conventional variations of the Czochralski crystal growing method. If a wafer substrate that is free of oxygen is desired, the starting material is preferably sliced from a single crystal ingot grown in accordance with any of the conventional variation of the float-zone crystal growing method. Growing a silicon ingot, as well as standard silicon slicing, lapping, etching, and polishing techniques, are well known in the art and disclosed for instance in U.S. Pat. Nos. 6,517,632 E2 and 7,033,962 B2.

In accordance with the present invention the epitaxial deposition preferably is carried out by chemical vapor deposition. Generally speaking, chemical vapor deposition involves exposing the surface of the wafer to an atmosphere comprising silicon in an epitaxial deposition reactor, e.g. an EPI CENTURA® reactor (Applied Materials, Santa Clara, Calif.).

Such an epitaxial deposition reactor comprises a chamber usually constructed of quartz, a gas inlet for allowing process gases to enter the reactor, a gas outlet for removing process gases from the reactor, a heating element for heating the semiconductor wafer, a susceptor for supporting the wafer and rotatable means for supporting the susceptor and wafer.

In more detail, the process chamber is constructed substantially symmetrically and comprises an upper cover, a lower cover and a sidewall, which enclose a reactor space, in which a semiconductor wafer is coated by means of vapor deposition. The semiconductor wafer to be coated is held by a susceptor arranged in the reactor space. Radiant heating systems and for heating the semiconductor wafer to a specific deposition temperature are situated above the upper cover and below the lower cover. Furthermore, connections and for introducing process gas into the process chamber and for discharging process gas and gaseous products of the process gas from the process chamber through the sidewall of the process chamber are present. The process chamber furthermore comprises a cooling system for cooling the upper cover and the lower cover, for example a fan, which conducts a cooling gas against the upper and lower covers, and heat exchangers, which draw heat from the cooling gas heated up in contact with the covers. The direction of movement of the cooling gas is indicated by arrows. The cooling system acts as an actuating device of a control loop for controlling the temperature of the upper cover of the process chamber.

In general, a single side polished wafer with etched backsides or a double side polished wafer have a native oxide layer on the front and back surfaces. In accordance with the present invention, the epitaxial deposition process incorporates the removal of the native oxide layer from at least the front surface of the semiconductor wafer prior to depositing the epitaxial layer on the front surface.

Furthermore, the removal step (baking step) can be combined with a wafer etching step prior to the epitaxial deposition process.

The removal of the native oxide layer is preferably accomplished by heating the surface of the wafer in an atmosphere consisting essentially of no oxidants (most preferably, the atmosphere is oxidant-free) until the silicon oxide layer is removed from the surface.

In a particularly preferred embodiment, the surface of the wafer is heated to a temperature of at least about 1050° C., more preferably to a temperature of at least about 1100° C., and most preferably to a temperature of at least about 1130° C. This heating preferably is conducted while exposing the entire front surface and substantially the entire back surface of the wafer to a cleaning gas comprising $H_2$, or a combination of $H_2$ and an etching gas like HCl for etching the surface of the wafer. Most preferably, the cleaning gas consists essentially of $H_2$.

The flow rate of the cleaning gas is typically between about 5 slm standard liter per minute (slm) and about 100 slm and preferably between about 20 slm and about 60 slm for at least about 10 seconds at a preferred temperature of at least about 1130° C.

For the etching step prior to the epitaxial deposition process, the flow rate of the etching gas is typically between about 0.2 slm standard liter per minute (slm) and about 2.0 slm and preferably between about 0.5 slm and about 0.6 slm for at least about 10 seconds at a preferred temperature of at least about 1130° C.

Following the removal of native oxide layer from at least the front surface of the semiconductor wafer, the flow of cleaning gas is discontinued and the temperature in the reaction chamber is adjusted to between about 1050° C. and about 1150° C., preferably at least about 1090° C. and more preferably at least about 1110° C.

The front surface of the wafer is then contacted with a silicon containing source gas to deposit the epitaxial layer onto the front surface.

Preferably, the surface is contacted with the source gas for more than 5 seconds after the native oxide is removed in order to allows the temperature of the semiconductor wafer to stabilize and become uniform. The uniform temperature profile is essential for both avoiding crystallographic sliplines from temperature non-uniformities and the prevention of the edge roll-off.

The epitaxial deposition preferably is carried out by chemical vapor deposition. In a preferred embodiment of this invention, the surface of the wafer is exposed to an atmosphere comprising a volatile gas comprising silicon (e.g., $SiCl_4$, $SiHCl_3$, $SiH_2Cl_2$, $SiH_3Cl$, or $SiH_4$). The atmosphere also preferably contains a carrier gas (most preferably $H_2$). In a preferred embodiment, the source of silicon during the epitaxial deposition is $SiHCl_3$.

In accordance with one preferred configuration of the present invention, the silicon source gas is generated by bubbling $H_2$ gas through $SiCl_3$ at approximately 50-55° F. and 15-25 psig.

The flow rate of the silicon source gas is preferably about 5 slm to 15 slm, more preferably about 5 slm to 8 slm, or 6 to 7 slm. The silicon source gas can be mixed in with a carrier gas, preferably $H_2$, and a dopant source gas, preferably ($PH_3$, $B_2H_6$, or $AsH_3$ mixed with $H_2$). The total flow rate of the hydrogen gas as the carrier gas is preferably about 20 slm to 60 slm, more preferably about 30 slm to 50 slm, or 35 slm to 45 slm.

During the deposition process, the pressure within the reaction chamber is preferably from about 720 to about 760 Torr, whereby an upper or lower endpoint within this range could be 725, 730, 735, 740, 745, 750, or 755.

An epitaxial deposition using $SiHCl_3$ may be conducted at or close to atmospheric pressure. This is advantageous because no vacuum pump is required and the reactor chamber does not have to be as robust to prevent collapse.

During the epitaxial deposition, the temperature of the wafer surface preferably is maintained at a temperature sufficient to prevent the atmosphere comprising silicon from depositing polycrystalline silicon onto the surface. Generally, the temperature of the surface during this period preferably is maintained at from about 1050 to about 1150° C. or 1075 to 1125° C. Most preferably, the temperature of the surface is maintained at 1100° C.

The rate of growth of the epitaxial layer is preferably about 2.0 μm/min to about 4.0 μm/min, or 2.5 μm/min to about 3.5 μm/min, or 2.75 μm/min to about 3.25 μm/min, when the deposition is conducted under the preferred pressure.

Once an epitaxial layer having the desired thickness has been formed, the atmosphere comprising silicon preferably is purged from the reaction chamber with a noble gas, $H_2$, or a combination thereof, and more preferably with $H_2$ alone.

Afterward, the wafer preferably is cooled to a temperature at which it can be handled without imparting damage (typically no greater than about 800-900° C.) and is then removed from the epitaxial deposition reactor.

In accordance with the present invention the thickness of the deposited epitaxial layer preferably is more than 30 μm and more preferred between 50 and 150 μm and most preferred between 60 and 100 μm. With increasing thickness of the deposited epitaxial layer, silicon deposits on the inner parts of the reaction chamber increases, too. This unwanted coating may result in problems of the ongoing epitaxial coating process, for instance due to uneven heating of the semiconductor wafer located in the reaction chamber.

The inventors discovered, that the flow rate of the carrier gas is a critical parameter in preventing the coating of the inner parts of the reaction chamber. This becomes more critical while depositing an epitaxial layer with a thickness of at least 40 μm resulting in an increased coating of the inner parts of the reaction chamber, especially of the upper cover 2.

The flow rates of both the carrier gas and the silicon source gas affect the edge geometry of the semiconductor wafer as well as the uniformity and thickness of the epitaxial layer. These gases are distributed across the chamber entrance by passing through a baffle plate, typically consisting of an array of holes in a quartz surface, and then passing through a channel that exits into the chamber. The pressure difference between the inlet and outlet of the baffle affects the gas velocity and distribution passing through the plate and channel and therefore the distribution across the inlet of the chamber.

The geometry of the epitaxially coated semiconductor wafer is usually degraded at higher carrier gas flows. Especially near the edge of the semiconductor wafer, the thickness of the epitaxial layer will typically decrease with relation to thickness across the remaining wafer surface as carrier gas flow increases.

The inventors discovered, that increasing the flow rate of the carrier gas and simultaneously reducing the flow rate of the silicon source gas prevent silicon coatings in the inner part of the reaction chamber and therefore the non-uniform temperature distribution especially where the wafer is in contact with the susceptor.

For example, if established flow rates for silicon source gas and carrier gas for thinner epitaxial layers, i.e. layers less than 40 μm, are 10 slm and 40 slm respectively, the flow rates of the silicon source gas and carrier gas for thicker epitaxial layers, i.e. layers in the range of 40 to 150 μm, could be—according to an aspect of the present invention— established at 6 slm and 60 slm respectively.

Since the silicon source gas/carrier gas ratio is critical for epitaxial processes, especially the flow rate of the carrier gas, e.g. $H_2$, seems to be the most critical parameter in order to prevent the unwanted coating of the inner parts of the reaction chamber.

According to the present invention, the flow rate of the carrier gas is set to be >55 slm to prevent excessive silicon deposition on the upper dome. In order to reduce the deterioration of the wafer geometry and epi layer thickness variation, the flow rate of the silicon source gas is preferably between 5 and 8 slm for the deposition of layers on a semiconductor surface with a layer thickness above 40 μm.

Because of the fact that the thicker epitaxial layers require longer deposition times, slip within the crystalline structure of the wafer and wafer resistivity variations must be avoided. Both slip and wafer resistivity variations are best optimized by lowering the bake and deposit temperatures. By lowering the deposition temperature more power can be shifted to the front of the wafer, i.e. to adjust the temperature on the top and the bottom of wafer and inside to outside in order to control the temperature uniformity of the wafer.

For example, the deposition temperature can be dropped from 1130° C. to 1100° C. for the deposition of thicker epitaxial layers with the inventive procedure while avoiding slip within the crystalline structure of the wafer and wafer resistivity variations.

It should be noted here, that below a certain deposition temperature, unwanted bridging between wafer and coated susceptor may occur. For instance, the inventors discovered, that bridging, i.e. that the wafer and supporting surface (boat, susceptor, pin, etc.) has grown together during the deposition process, occurs at a deposition temperature of 1060° C. and a deposition rate of 3.25 μm/min, while at a deposition temperature of 1090° C. and a deposition rate of 3.25 μm/min no bridging between wafer and coated susceptor was observed.

Since the thicker epi has possibly more potential for large area defects, and the lower deposit and bake temp is possibly not as robust for surface contamination, a wafer etch prior to deposit is added within the inventive method.

With the inventive method wafers with a thick epitaxial layer, i.e. 40 to 150 μm, characterized by a minor slip and a good geometry are available. For instance, a wafer produced with the inventive method with a thickness of the epitaxial layer of 110 μm has a slip/dislocation of <15 mm, a flatness SFQR (25×25 mm, no PI) of 0.8 μm at 50% and a WARP of 40 μm at 50%. Due to the additional wafer etch prior to the deposition, the LLS values after cleaning the wafer are at a very low value, i.e. 6 at 50% for LLS≥0.2 μm, 4 at 50% for LLS≥0.3 μm.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B, and C" should be interpreted as one or more of a group of elements consisting of A, B, and C, and should not be interpreted as requiring at least one of each of the listed elements A, B, and C, regardless of whether A, B, and C are related as categories or otherwise. Moreover, the recitation of "A, B, and/or C" or "at least one of A, B, or C" should be interpreted as including any singular entity from the listed elements, e.g., A, any subset from the listed elements, e.g., A and B, or the entire list of elements A, B, and C.

The invention claimed is:

1. A method for depositing a layer on a semiconductor wafer by vapor deposition in a process chamber, the method comprising:
    removing native oxide from a surface of the semiconductor wafer; and then
    depositing an epitaxial layer with a thickness in a range of from 50 to 150 μm on the surface of the semiconductor wafer, by a process comprising introducing a silicon-comprising gas and a carrier gas comprising $H_2$ into the process chamber,
    wherein the surface of the semiconductor wafer has a temperature of at least 1050° C. during the depositing;
    wherein a silicon-comprising gas flow rate is in a range from at least 5 to lower than 10 standard liters per minute, and
    wherein a carrier gas flow rate is at least 40 standard liters per minute.

2. The method of claim 1, wherein the silicon-comprising gas flow rate is at 5 to 8 standard liters per minute, and
    wherein the carrier gas flow rate is more than 50 standard liters per minute.

3. The method of claim 2, further comprising:
    adjusting a temperature in the process chamber to between 1050° C. and 1150° C. during the depositing of the epitaxial layer.

4. The method of claim 1, further comprising:
    adjusting a temperature in the process chamber to between 1050° C. and 1150° C. during the depositing of the epitaxial layer.

5. The method of claim 1, further comprising:
    etching the semiconductor wafer before the depositing of the epitaxial layer.

6. The method of claim 1, wherein the epitaxial layer has a thickness in a range of from 60 to 150 μm.

7. The method of claim 1, wherein the epitaxial layer has a thickness in a range of from 60 to 100 μm.

8. The method of claim 1, wherein the surface of the semiconductor wafer has a temperature of at least 1100° C. during the depositing.

9. The method of claim 1, which produces a semiconductor wafer, comprising:
    the epitaxial layer having a thickness of 40 μm to 150 μm;
    slip lines of less than 15 mm; and
    a flatness SFQRmax (25×25 mm pattern) of not more than 0.8 μm.

10. The method of claim 9, wherein the semiconductor wafer has not more than 6 LLS defects≥0.2 μm and not more than 4 LLS defects≥0.3 μm.

11. The method of claim 1, wherein the epitaxial layer has a thickness in a range of from 100 to 150 μm.

12. The method of claim 1, wherein the epitaxial layer has a thickness in a range of from 50 to 60 μm.

13. The method of claim 1, wherein the carrier gas flow rate is greater than 40 standard liters per minute.

14. The method of claim 1, wherein the carrier gas flow rate is up to 60 standard liters per minute.

15. The method of claim 1, wherein the carrier gas flow rate is greater than 55 standard liters per minute.

16. The method of claim 15, wherein the carrier gas flow rate is up to 60 standard liters per minute.

* * * * *